US012309918B2

(12) United States Patent
Lee et al.

(10) Patent No.: US 12,309,918 B2
(45) Date of Patent: May 20, 2025

(54) CIRCUIT BOARD HAVING EMBEDDED ELECTRONIC COMPONENT AND METHOD FOR MANUFACTURING THE SAME

(71) Applicant: TRIPLE WIN TECHNOLOGY(SHENZHEN) CO.LTD., Shenzhen (CN)

(72) Inventors: Ming-Hsun Lee, New Taipei (TW); Chen-En Lin, New Taipei (TW)

(73) Assignee: TRIPLE WIN TECHNOLOGY(SHENZHEN) CO.LTD., Shenzhen (CN)

( * ) Notice: Subject to any disclaimer, the term of this patent is extended or adjusted under 35 U.S.C. 154(b) by 191 days.

(21) Appl. No.: 18/070,344

(22) Filed: Nov. 28, 2022

(65) Prior Publication Data
US 2024/0107666 A1    Mar. 28, 2024

(30) Foreign Application Priority Data
Sep. 26, 2022    (CN) .......................... 202211177202.4

(51) Int. Cl.
*H05K 1/18*        (2006.01)
*H05K 1/02*        (2006.01)
*H05K 1/11*        (2006.01)

(52) U.S. Cl.
CPC ........... *H05K 1/0298* (2013.01); *H05K 1/184* (2013.01); *H05K 2201/10651* (2013.01)

(58) Field of Classification Search
CPC ........ H05K 1/184; H05K 1/185; H05K 1/186; H05K 2201/10651; H05K 1/0298; H05K 1/115; H05K 1/116
See application file for complete search history.

(56) References Cited

U.S. PATENT DOCUMENTS

| 2006/0054352 A1* | 3/2006 | Ryu | H05K 1/185 174/262 |
| 2011/0024175 A1* | 2/2011 | Satou | H01G 4/232 174/260 |
| 2021/0060900 A1* | 3/2021 | Huang | H05K 1/036 |

FOREIGN PATENT DOCUMENTS

TW           201431452 A     8/2014

* cited by examiner

*Primary Examiner* — Roshn K Varghese
(74) *Attorney, Agent, or Firm* — ScienBiziP, P.C.

(57) ABSTRACT

A circuit board includes a first electronic component and a circuit substrate. The first electrode component includes two electrodes. The circuit substrate includes an inner substrate and an outer substrate formed on the inner substrate. The inner substrate defines a receiving cavity, and the first electronic component received in the receiving cavity. Each electrode faces an inner sidewall of the receiving cavity. The inner substrate includes a first insulating layer and a blocking layer embedded in the first insulating layer, an end of the blocking layer exposed from the inner sidewall. The outer substrate defines two through holes. Each through hole passes through a portion of the first insulating layer connected to the inner sidewall and exposes the blocking layer. A top end of each of the two electrodes facing the outer substrate is partially received in one through hole.

9 Claims, 5 Drawing Sheets

CIRCUIT BOARD HAVING EMBEDDED ELECTRONIC COMPONENT AND METHOD FOR MANUFACTURING THE SAME

FIELD

The subject matter relates to imaging devices, and more particularly, to a circuit board and an electronic device having the circuit board.

BACKGROUND

Electronic devices, such as mobile phones or tablet computers, may include circuit boards. The size of the circuit board may affect the size of the electronic device. To reduce the size of the circuit board, an electronic component, such as a capacitor, may be embedded in the circuit substrate of the circuit board. However, the size of the electrodes of the electronic component needs to be increased to avoid position accuracy problem. However, the increase of the electrodes may increase the overall size of the circuit board. Moreover, the circuit substrate may also define a through hole for exposing the electrodes of the electronic component. When defining the through hole in the circuit board, position accuracy of the through hole may also affect the quality of the entire circuit board.

Therefore, there is room for improvement in the art.

BRIEF DESCRIPTION OF THE DRAWINGS

Implementations of the present technology will now be described, by way of example only, with reference to the attached figures.

DETAILED DESCRIPTION

Figure 1:
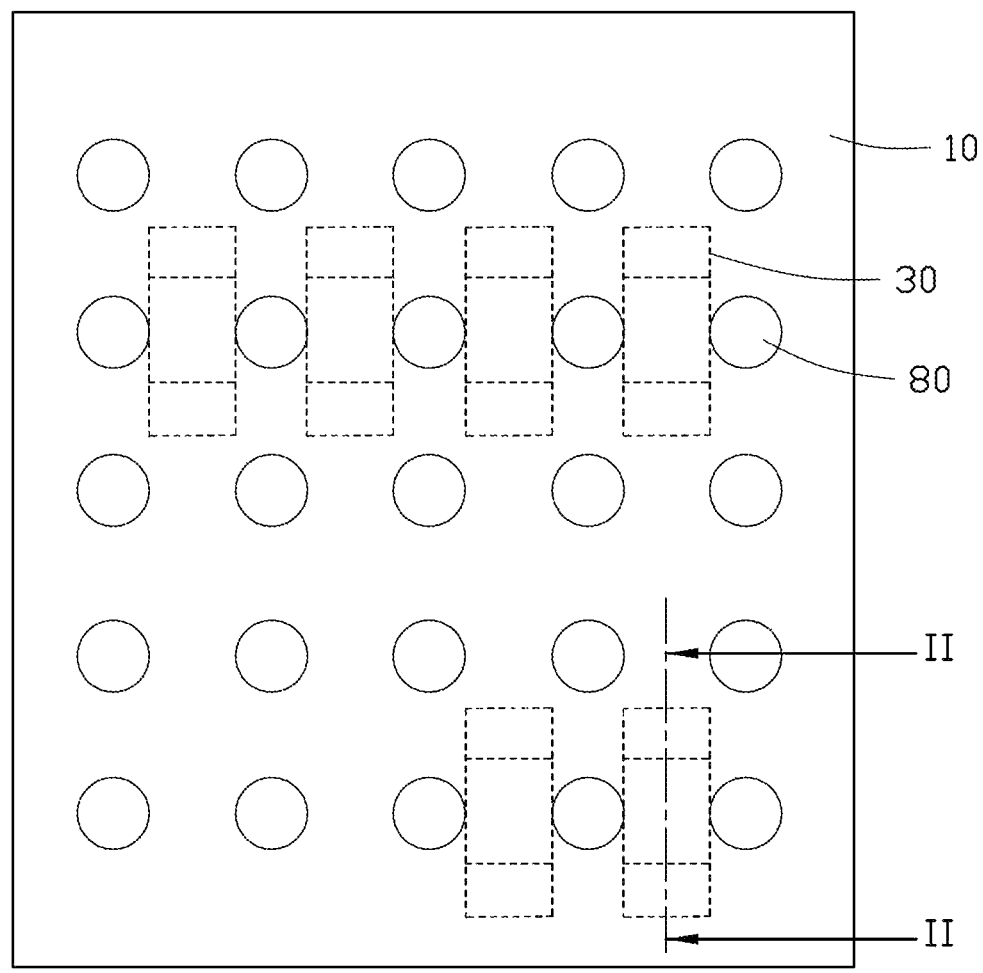
FIG. 1 is a diagrammatic view of a circuit board according to an embodiment of the present disclosure.

It will be appreciated that for simplicity and clarity of illustration, where appropriate, reference numerals have been repeated among the different FIG.s to indicate corresponding or analogous components. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Figure 2:
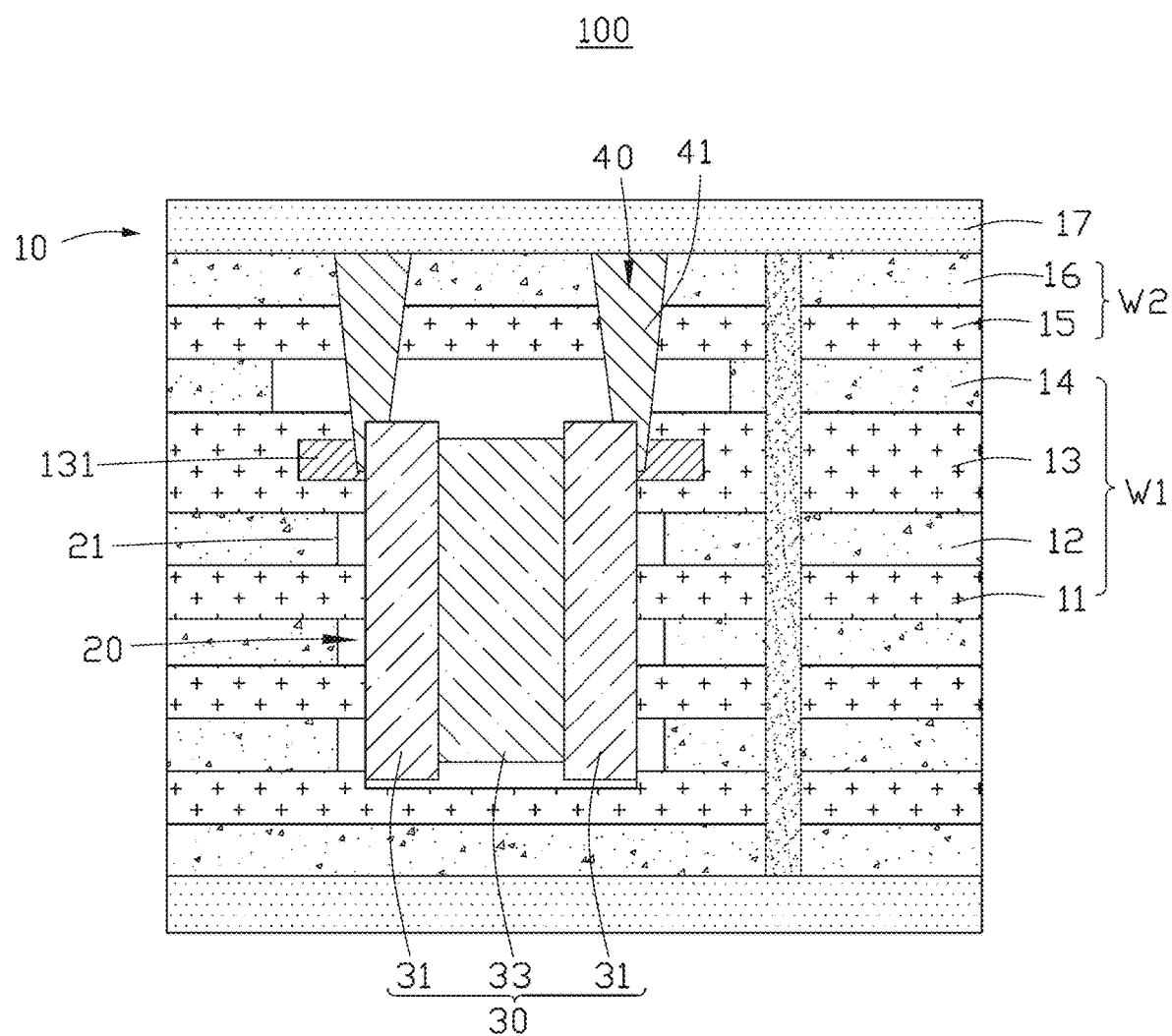
FIG. 2 is a cross-sectional view along II-II of FIG. 1.

Referring to FIGS. 1 and 2, an embodiment of a circuit board 100 is provided, which includes a circuit substrate 10, a first electronic component 30 embedded in the circuit substrate 10, and a second electronic component 80 disposed on the circuit substrate 10. In at least one embodiment, the circuit substrate 10 may be a PCB, a Flexible Printed Circuit (FPC), a Rigid Flex Printed Circuit (RFPC), or a ceramic substrate.

The circuit substrate 10 includes an inner substrate W1 and an outer substrate W2 stacked on the inner substrate W1. The inner substrate W1 includes a base layer 11, a first conductive layer 12, a first insulating layer 13, and a second conductive layer 14 stacked in that order. The inner substrate W1 further includes a blocking layer 131 embedded in the first insulating layer 13. A melting point of the blocking layer 131 is higher than that of the first insulating layer 13. The inner substrate W1 defines a receiving cavity 20 that passes through the base layer 11, the first conductive layer 12, the first insulating layer 13, and the second conductive layer 14. An end of the blocking layer 131 may be exposed from the inner sidewall 21 of the receiving cavity 20. The first electronic component 30 is disposed in the receiving cavity 20. The first electronic component 30 includes two electrodes 31 spaced from each other and a dielectric body 33 between the two electrodes 31. Each electrode 31 faces the inner sidewall 21 of the receiving cavity 20. In at least one embodiment, a gap (not labeled) may be defined between each electrode 31 and the inner sidewall 21 of the receiving cavity 20, thereby preventing the first electronic component 30 to collide with the inner sidewall 21 of the receiving cavity 20.

The outer substrate W2 is formed on the second conductive layer 14 and covers the receiving cavity 20. The outer substrate W2 includes a second insulating layer 15 and a third conductive layer 16. The second insulating layer 15 is sandwiched between the third conductive layer 16 and the second conductive layer 14. Each of the first conductive layer 12, the second conductive layer 14, and the third conductive layer 16 includes conductive wirings. The conductive wirings of the first conductive layer 12 and the second conductive layer 14 are spaced from the receiving cavity 20. The conductive wirings may be copper conductive wirings. The blocking layer 131 may be a copper layer.

The outer substrate W2 defines two through holes 40. An extending line of the center axis of each through hole 40 may be aligned with a contacting surface between the one electrode 31 and the inner sidewall 21 of the receiving cavity 20. When there is a gap between one electrode 31 and the inner sidewall 21 of the receiving cavity 20, the center axis of each through hole 40 may also pass through the gap between one electrode 31 and the inner sidewall 21 of the receiving cavity 20. Each through hole 40 passes through the second insulating layer 15 and the third conductive layer 16. Each through hole 40 further passes a portion of the second insulating layer 15 connected to the inner sidewall 21 of the receiving cavity 20. The through hole 40 may also passes through only a portion of the blocking layer 131. A top end of each electrode 31 facing the third conductive layer 16 is partially received in one through hole 40. A conductive material 41 is filled in each through hole 40 to electrically connect the electrode 31 to the third conductive layer 16. Thus, the first electronic component 30 is electrically connected to the third conductive layer 16 to form a circuit loop. The conductive material 41 is connected both to a top surface and a side surface of the top end of the electrode 31, thereby increasing the size of the contact area between the electrode 31 and the conductive material 41. Thus, the electric connection stability between the electrode 31 and the conductive material 41 is improved. In at least one embodiment, the conductive material 41 may be a metal material (such as copper) formed by electroplating.

The through hole 40 may be defined by laser beams. Since the melting point of the blocking layer 131 is higher than that of the first insulating layer 13, the blocking layer 131 is not easy to melt or vaporize when being irradiated by the laser beams, so as to block the laser beams and limit the depth of the through hole 40. Thus, the blocking layer 131 can limit the depth of the through hole 40. In other embodiments, the through hole 40 may also be defined by mechanically drilling.

The receiving cavity 20 may be defined by laser beams or mechanically drilling. The inner sidewall 21 of the receiving cavity 20 may not be flat. The inner sidewall 21 corresponding to the first conductive layer 12 may be recessed from the inner sidewall 21 corresponding to the base layer 11. The inner sidewall 21 corresponding to the first conductive layer 12 may be recessed from the inner sidewall 21 corresponding to the first insulating layer 13. That is, a buffer space is reserved in the first conductive layer 12 before the receiving cavity 20 is defined, thereby preventing damages to the first conductive layer 12 when defining the receiving cavity 20.

In at least one embodiment, the circuit substrate 10 further includes a protecting layer 17 formed on the outer substrate W2. The protecting layer 17 may be a solder mask layer or a cover layer (CVL).

In at least one embodiment, the first electronic component 30 is a 01005 Multilayer Ceramic Capacitor. The first electronic component 30 may have a length of 0.4 mm, a width of 0.2 mm, and a thickness of 0.2 mm. The electrode 31 has a length of 0.1 mm and a width of 0.2 mm. The following will describe the size relationship between the through hole 40 and the first electronic component 30 when taking the 01005 Multilayer Ceramic Capacitor as an example.

Figure 3:
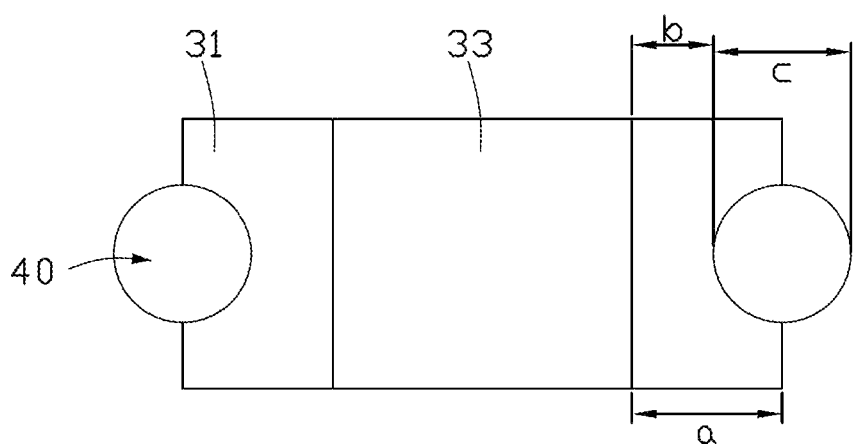
FIG. 3 is a top view of an electronic component and a through hole of the circuit board of FIG. 1.
Figure 4:
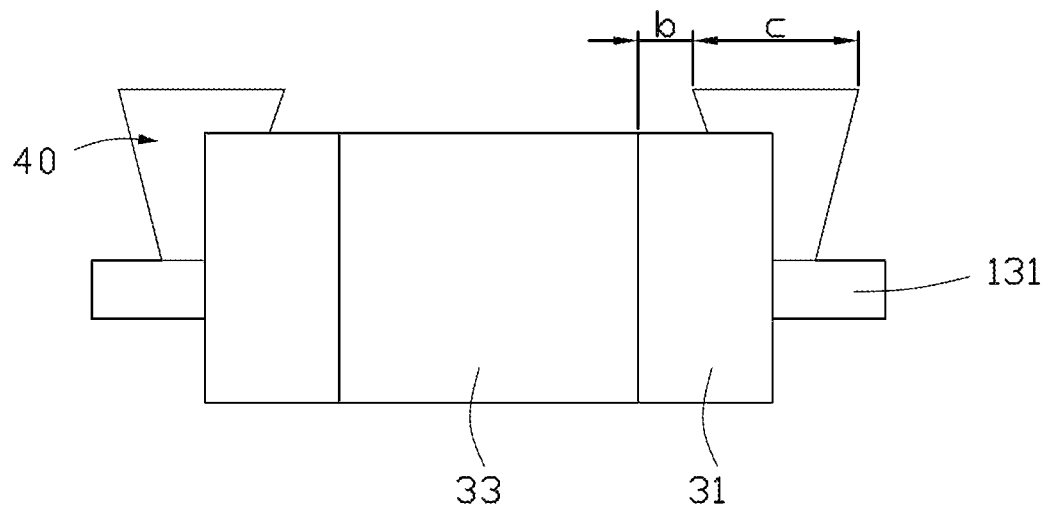
FIG. 4 is a bottom view of an electronic component and a through hole of the circuit board of FIG. 1.

Referring to FIGS. 3 and 4, the width "a" of electrode 31 is 0.1 mm, the distance "b" between the through hole 40 and the dielectric body 33 is 0.05 mm, and the diameter of the through hole 40 is 0.1 mm. In related art, a maximum deviation error when placing the first electronic component 30 into the receiving cavity 20 is about 30 μm. The maximum deviation error when defining the through hole 40 by laser beams is about 20 μm. That is, the overall position error is about 50 μm in the process of defining the through hole 40 corresponding to the electrode 31. Therefore, it is necessary to reserve a buffer spacing "b" when selecting the position of the through hole 40, so as to prevent the dielectric body 33 from being damaged by the laser beams.

In related art, in order to avoid the above position error, the size of the electrode 31 needs to be increased. However, the increase of the size of the electrode 31 may affect the overall size of the circuit board 100, and a user has limited choices when selecting the first electronic component 30. At the same time, the diameter of the laser beams needs to be decreased, which can increase the distance between the through hole 40 and the dielectric body 33.

In the present disclosure, since the through hole 40 passes a portion of the second insulating layer 15 connected to the inner sidewall 21 of the receiving cavity 20, thereby increasing the size of the contact area between the electrode 31 and the conductive material 41, and thus improving the electric connection stability. The diameter of the laser beams is not limited. When the position error is 50 μm, in order to ensure that the through hole 40 can pass a portion of the second insulating layer 15 connected to the inner sidewall 21, it is also necessary to reserve a distance of 50 μm. That is, the diameter "c" of the through hole 40 is 100 μm. The blocking layer 131 not only can limit the depth of the through hole 40, but can also limit the diameter "c" of the through hole 40.

Figure 5:
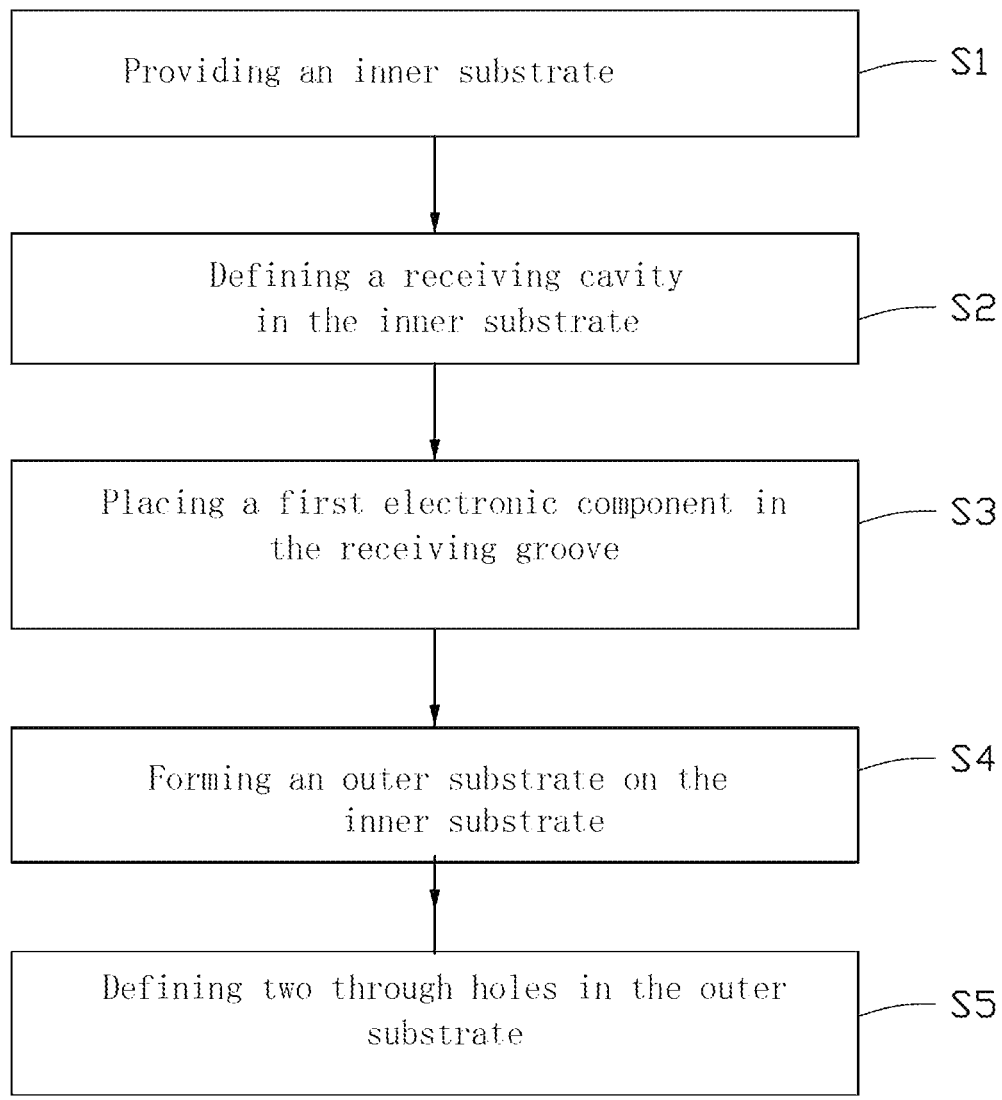
FIG. 5 is flowchart of a method for manufacturing a circuit board according to an embodiment of the present disclosure.

Referring to FIG. 5, a method for manufacturing a circuit board s is provided by way of example, as there are a variety of ways to carry out the method. Each block shown in the figure represents one or more processes, methods, or subroutines, carried out in the example method. Furthermore, the illustrated order of blocks is illustrative only and the order of the blocks can change. Additional blocks can be added, or fewer blocks may be utilized, or the order of the blocks may be changed, without departing from this disclosure. The method can begin at block S1.

S1, an inner substrate W1 is provided, which includes a base layer 11, a first conductive layer 12, a first insulating layer 13, and a second conductive layer 14 stacked in that order. The inner substrate W1 further includes a blocking layer 131 embedded in the first insulating layer 13.

S2, a receiving cavity 20 is defined in the inner substrate W1. The receiving cavity 20 passes through the base layer 11, the first conductive layer 12, the first insulating layer 13, and the second conductive layer 14. An end of the blocking layer 131 may be exposed from the inner sidewall 21 of the receiving cavity 20.

S3, a first electronic component 30 is placed in the receiving cavity 20. Each electrode 31 faces the inner sidewall 21 of the receiving cavity 20.

Step S4, an outer substrate W2 is formed on the second conductive layer 14 and covers the receiving cavity 20. The outer substrate W2 includes a second insulating layer 15 and a third conductive layer 16. The second insulating layer 15 is sandwiched between the third conductive layer 16 and the second conductive layer 14.

S5, two through holes 40 are defined in the outer substrate W2. Each through hole 40 passes through the second insulating layer 15 and the third conductive layer 16. Each through hole 40 further passes a portion of the second insulating layer 15 connected to the inner sidewall 21 of the receiving cavity 20, and also passes through the blocking layer 131 below the portion of the second insulating layer 15. A top end of each electrode 31 facing the third conductive layer 16 is partially received in one through hole 40. A conductive material 41 is filled in each through hole 40 to electrically connect the electrode 31 to the third conductive layer 16. The conductive material 41 is connected both to a top surface and a side surface of the top end of the electrode 31.

In the present disclosure, each through hole 40 further passes a portion of the second insulating layer 15 connected to the inner sidewall 21 of the receiving cavity 20. Thus, the distance between the through hole 40 and the dielectric body 33 is increased, which avoids damages to the dielectric body 33 caused by accuracy problems when defining the through hole 40. The conductive material 41 in the through hole 40 is connected both to a top surface and a side surface of the top end of the electrode 31, thereby increasing the size of the contact area between the electrode 31 and the conductive material 41. Thus, the electric connection stability between the electrode 31 and the conductive material 41 is improved. The blocking layer 131 is not easy to melt or vaporize when being irradiated by the laser beams, so as to limit the depth and the diameter of the through hole 40. Thus, the quality of the circuit board 100 is improved.

Even though information and advantages of the present embodiments have been set forth in the foregoing description, together with details of the structures and functions of the present embodiments, the disclosure is illustrative only. Changes may be made in detail, especially in matters of shape, size, and arrangement of parts within the principles of the present exemplary embodiments, to the full extent indicated by the plain meaning of the terms in which the appended claims are expressed.

What is claimed is:

1. A circuit board, comprising:
   a first electronic component comprising two electrodes;
   a circuit substrate comprising:
   an inner substrate defining a receiving cavity, the first electronic component received in the receiving cavity such that each of the two electrodes faces an inner sidewall of the receiving cavity, the inner substrate comprising a first insulating layer and a blocking layer embedded in the first insulating layer, a melting point of a material of the blocking layer being higher than a melting point of a material of the first insulating layer, an end of the blocking layer being exposed from the inner sidewall; and
   an outer substrate formed on the inner substrate and covering the receiving cavity, the outer substrate defining two through holes; wherein in a direction of a center axis of each of the two through holes, each of the two through holes extends through a portion of the first insulating layer which is connected to the inner sidewall; along the direction of the center axis, each of the two through holes further extends through a portion of the blocking layer, the blocking layer is configured to limit a depth of each of the two through holes, such that a remaining portion of the blocking layer is exposed from a bottom end of each of the two through holes, a top end of each of the two electrodes facing the outer substrate is partially received in the bottom end of a respective one of the two through holes.

2. The circuit board according to claim 1, wherein the outer substrate further comprises a conductive material filled in each of the two through holes, and the conductive material is connected to each of a top surface and a side surface of the top end of each of the two electrodes.

3. The circuit board according to claim 1, wherein an extending line of the center axis of each of the two through holes is aligned with a contacting surface between the respective one of the two electrodes and the inner sidewall.

4. The circuit board according to claim 1, wherein a gap is defined between one of the two electrodes and the inner sidewall.

5. The circuit board according to claim 4, wherein the center axis of each of the two through holes passes through the gap.

6. The circuit board according to claim 1, wherein the inner substrate further comprises a base layer, a first conductive layer, and a second conductive layer, the first insulating layer is sandwiched between the first conductive layer and the second conductive layer, and the receiving cavity extends through the base layer, the first conductive layer, the first insulating layer, and the second conductive layer.

7. The circuit board according to claim 6, wherein the outer substrate comprises a second insulating layer and a third conductive layer, and the second insulating layer is sandwiched between the third conductive layer and the second conductive layer.

8. The circuit board according to claim 6, wherein a portion of the inner sidewall which corresponds to the first conductive layer is recessed from another portion of the inner sidewall which corresponds to the base layer, and is also recessed from yet another portion of the inner sidewall which corresponds to the first insulating layer.

9. The circuit board according to claim 1, wherein the blocking layer is made of copper.

* * * * *